United States Patent
Kim

Patent Number: 6,133,081
Date of Patent: Oct. 17, 2000

[54] METHOD OF FORMING TWIN WELL

[75] Inventor: Jong-Kwan Kim, Chungcheongbuk-do, Rep. of Korea

[73] Assignee: LG Semicon Co., Ltd., Chongcheongbuk-do, Rep. of Korea

[21] Appl. No.: 09/287,365

[22] Filed: Apr. 7, 1999

[30]     Foreign Application Priority Data

May 7, 1998  [KR]   Rep. of Korea ........................ 98-16234

[51] Int. Cl.$^7$ .............................................. H01L 21/8249
[52] U.S. Cl. ........................ 438/227; 438/228; 438/225; 438/223; 438/224
[58] Field of Search .................................... 438/199, 218, 438/221, 223, 224, 225, 227, 228

[56]              References Cited

U.S. PATENT DOCUMENTS

| | | |
|---|---|---|
| 5,573,963 | 11/1996 | Sung . |
| 5,693,505 | 12/1997 | Kobayashi . |
| 5,759,884 | 6/1998 | Youn ........................................ 438/228 |
| 5,795,803 | 8/1998 | Takamura et al. ....................... 438/228 |

*Primary Examiner*—Trung Dang

[57]              ABSTRACT

A method of forming a twin well includes the steps of: forming a field oxide layer on a semiconductor substrate to define active regions of a device, and forming a first mask which exposes a predetermined active region of the semiconductor substrate; ion-implanting a first conductivity type impurity into the exposed region of the semiconductor substrate using the first mask as an ion implantation mask, to form a first well; ion-implanting a second conductivity type impurity to penetrate the first mask, to form a buried region which is self-aligned with the first well and comes into contact with the bottom of the field oxide layer; removing the first mask, and forming a second mask which is to expose the first well of the semiconductor substrate; and ion-implanting a second conductivity impurity into the exposed region of the semiconductor substrate to levels deeper and shallower than the buried region using the second mask as an ion implantation mask, to form a second well including the buried region. The second well self-aligned with the first well. Damages due to ion implantation is not generated, preventing leakage current at the contact surface between the first well and semiconductor substrate. The surface impurity concentration of the second well is easily controlled, improving reproducibility.

9 Claims, 7 Drawing Sheets

METHOD OF FORMING TWIN WELL

BACKGROUND OF THE INVENTION

1. Field of the Invention

The present invention relates to a method of forming a twin well and, more particularly, to a method of forming a twin well, in which a second well is self-aligned with a first well to scale down the design rule for the well.

2. Discussion of Related Art

A CMOS transistor is constructed in such a manner that PMOS and NMOS transistors are respectively formed in two different regions having conductivities opposite to each other placed in a semiconductor substrate. These regions having conductivities different from each other have a single well or twin well structure. The single well structure is obtained that one-time impurity implantation process is performed for a predetermined portion of the semiconductor substrate to form a well having a conductivity opposite to that of the semiconductor substrate. With the twin well structure, impurity implantation is carried out for a P- or N-type semiconductor substrate twice to form P- and N-type wells. The concentration of the twin well is controlled more accurately than the single well because the well having the same conductivity as that of the substrate is formed through a separate ion implantation. Accordingly, the substrate resistance can be easily controlled, reducing latch-up.

In general, the twin well is divided into a double diffused twin well, retrograde twin well and buried implanted for lateral isolation (BILLI) retrograde twin well structures. The double diffused twin well is formed by ion-implanting P- and N-type impurities into a semiconductor substrate respectively using separate ion implantation masks. With this well structure, the impurity concentration in depth direction of the well is difficult to control. To overcome this problem, there have been developed the retrograde twin well and BILLI retrograde twin well structures in which P- and N-type impurities are ion-implanted several times to control the well concentration easily. In the retrograde twin well and BILLI retrograde twin well, their surface impurity concentrations are reduced to prevent punch-through and the impurity concentrations of their deep portions are increased to decrease the well resistance without varying the surface concentration which affects junction capacitance and substrate bias effect, improving resistance to latch-up.

FIGS. 1A and 1B illustrate a conventional method of forming a retrograde twin well.

Referring to FIG. 1A, a field oxide layer 13 is formed on a P- or N-type semiconductor substrate 11 to define a plurality of active regions. Photoresist is coated on semiconductor substrate 11 by 2.3 to 2.7 $\mu$m, exposed and developed, to form a first mask 14 exposing a specific active region. An N-type impurity such as P or As is ion-implanted into the exposed region of semiconductor substrate 11 several times continuously, varying implantation energy and dose, using first mask 14 as an ion implantation mask, forming an N-type well, first well 15. Specifically, P or As is primarily implanted with a high energy of 650 to 750 KeV and with dose of about $1\times10^{13}/cm^2$, and secondarily implanted with an energy of 200 to 300 KeV and with dose of about $1\times10^{12}/cm^2$. Subsequently, the third implantation is performed with a low energy of 50 to 150 KeV and with dose of about $1\times10^{12}/cm^2$, forming first well 15 having impurity concentration which varies with its depth.

The first implantation increases the impurity concentration of deeper region of first well 15 to reduce the well resistance, decreasing latch-up of CMOS transistor to be formed. The second implantation improves channel stop effect under field oxide layer 13, and third implantation controls the surface impurity concentration of first well 15, preventing punch-through.

Referring to FIG. 1B, after removal of first mask 14, photoresist is coated on semiconductor substrate 11 by 2.3 to 2.7 $\mu$m, exposed and developed, to form a second mask 16 exposing a region of semiconductor substrate 11, in which first well 15 is not formed. A P-type impurity such as B or $BF_2$ is ion-implanted into the exposed region of substrate 11 several times continuously, varying implantation energy and dose, using second mask 16 as an ion implantation mask, to form a P-type well, second well 17. Specifically, B or $BF_2$ is primarily implanted with a high energy of 450 to 550 KeV and with dose of about $1\times10^{13}/cm^2$, and secondarily implanted with an energy of 100 to 200 KeV and with dose of about $1\times10^{12}/cm^2$. Subsequently, the third implantation is performed with a low energy of 30 to 50 KeV and with dose of about $1\times10^{12}/cm^2$, forming second well 17 having impurity concentration which varies with its depth. Here, second mask 16 prevents the that P-type impurity is implanted into first well 15. The first implantation increases the impurity concentration of deeper region of first well 17 to reduce the well resistance, decreasing latch-up of CMOS transistor to be formed. The second implantation improves channel stop effect under field oxide layer 13, and third implantation controls the surface impurity concentration of second well 17, preventing punch-through.

FIGS. 2A and 2B are graphs each of which shows the relationship between depth and impurity concentration in the retrograde twin well conventionally fabricated. FIGS. 2A shows the relationship between the impurity concentration and depth of first well 15, and FIG. 2B shows the relationship between the impurity concentration and depth of second well 17.

First and second wells 15 and 17 are formed in a manner that N- and P-type impurities are ion-implanted several times, for example, three times, varying ion implantation energy and dose. Accordingly, each well has three impurity concentration peaks. That is, each of first and second well 15 and 17 has an impurity concentration peak of $5\times10^{17}$ to $1\times10^{18}/cm^3$ at a depth of 0.8 to 1.0 $\mu$m according to the first implantation. Thus, well resistance is reduced to decrease latch-up. Furthermore, each of first and second well 15 and 17 has another peak of $1\times10^{17}$ to $3\times10^{18}/cm^3$ at a depth of 0.4 to 0.5 $\mu$m, that is, under field oxide layer 13, according to the second implantation. This improves channel stop effect. Moreover, each well has the peak of about $1\times10^{17}/cm^3$ at a depth of 0.1 to 0.2 $\mu$m according to the third implantation, preventing punch-through in the substrate 11.

As described above, the conventional method of forming a retrograde twin well uses two masks to form the first and second wells, varying implantation energy and dose several times. However, it is difficult to scale down the design rule for the wells because the first and second wells are not self-aligned with each other.

To solve this problem, there has been proposed the BILLI retrograde twin well structure in which the first and second wells are formed in self-alignment using only one mask in an ion implantation process.

FIGS. 3A and 3B illustrate a conventional method of forming a BILLI retrograde twin well.

Referring to FIG. 3A, a field oxide layer 23 is formed on a P- or N-type semiconductor substrate 21 to define a plurality of active regions. Photoresist is coated on semiconductor substrate 21 by 2.3 to 2.7 μm, exposed and developed, to form a mask 24 exposing a predetermined active region. An N-type impurity such as P or As is ion-implanted into the exposed region of semiconductor substrate 21 several times continuously, varying implantation energy and dose, using mask 24 as an ion implantation mask, forming an N-type well, first well 25. Specifically, P or As is primarily implanted with a high energy of 650 to 750 KeV and with dose of about $1\times10^{13}/cm^2$, and secondarily implanted with an energy of 200 to 300 KeV and with dose of about $1\times10^{12}/cm^2$. Subsequently, the third implantation is performed with a low energy of 50 to 150 KeV and with dose of about $1\times10^{12}/cm^2$, forming first well 25 having impurity concentration which varies with its depth.

The first implantation increases the impurity concentration of deeper region of first well 25 to reduce the well resistance, decreasing latch-up of CMOS transistor to be formed. The second implantation improves channel stop effect under field oxide layer 23, and third implantation controls the surface impurity concentration of first well 25, preventing punch-through.

Referring to FIG. 3B, a P-type impurity such as B or $BF_2$ is ion-implanted into substrate 21 several times continuously, varying implantation energy and dose to penetrate mask 24, to form a P-type well, second well 27 in a region of substrate 21, in which first well 25 is not formed. Specifically, B or $BF_2$ is primarily implanted with an energy of 1.5 to 2.5 MeV and with dose of about $1\times10^{13}/cm^2$, and secondarily implanted with an energy of 1.3 to 1.7 MeV and with dose of about $1\times10^{12}/cm^2$. Subsequently, the third implantation is performed with an energy of 1.0 to 1.1 MeV and with dose of about $1\times10^{12}/cm^2$, forming second well 27 having impurity concentration which varies with its depth in a region of substrate 21, where first well 25 is not formed. Here, while B or $BF_2$ is also implanted into the region on which mask 24 is not formed, this impurity passes through first well 25, forming a P-type buried region 26 under first well 25. P-type buried region 26 does not come into contact with second well 27.

The first implantation increases the impurity concentration of deeper region of second well 27 to reduce its well resistance, decreasing latch-up of CMOS transistor to be formed. The second implantation improves channel stop effect under field oxide layer 23, and third implantation controls the surface impurity concentration of first well 25, preventing punch-through. Second well 27 is self-aligned with first well 25 since the impurity for forming it penetrates first well 25 and mask 24.

FIGS. 4A and 4B are graphs each of which shows the relationship between depth and impurity concentration in the BILLI retrograde twin well conventionally fabricated. FIG. 4A shows the relationship between the impurity concentration and depth of first well 25, and FIG. 4B shows the relationship between the impurity concentration and depth of second well 27. In FIG. 4A, the curve corresponding to shallower region denotes the impurity concentration of first well 25, and curve corresponding to deeper region denotes buried region 26 under first well 25.

Referring to FIG. 4A, N-type impurity concentration of first well 25 increases with going into deeper from the surface of substrate 21, reaches its peak of $1\times10^{17}$ to $5\times10^{17}/cm^3$ at a depth of 0.6 to 0.8 μm and then starts to decrease. P-type impurity concentration of buried region 26 formed under first well 25 starts to increase at the region where the N-type impurity concentration is reduced, reaches its peak of $1\times10^{17}$ to $5\times10^{17}/cm^3$ at a depth of 2.5 to 3.0 μm and then starts to decrease.

Referring to FIG. 4B, N-type impurity concentration of second well 27 increases to reach its peak of $1\times10^{17}$ to $5\times10^{17}/cm^3$ at a depth of 0.8 to 1.2 μm, and then starts to decrease. Thus, the well resistance is reduced, decreasing latch-up.

As described above, the BILLI retrograde twin well is formed in such a manner that, without removing the mask used for forming the first well, P-type impurity is ion-implanted with a high energy to penetrate the mask to form the second well self-aligned with the first well. Accordingly, the design rule for the well is scale down, improving the integration of the device.

However, during formation of the second well, the impurity is also implanted below the first well to form the buried region. When the dose of impurity which is implanted under the first well exceeds $6\times10^{12}/cm^2$, damages due to ion implantation generate at points where impurity ions stop and grow toward the well surface, creating dislocation. This brings about leakage current at the contact between the semiconductor substrate and first well. Furthermore, the surface impurity concentration of the second well sensibly varies with the thickness of photoresist used as the mask, deteriorating reproducibility.

SUMMARY OF THE INVENTION

Accordingly, the present invention is directed to a method of forming a twin well that substantially obviates one or more of the problems due to limitations and disadvantages of the related art.

An object of the present invention is to provide a method of forming a twin well, in which a second well is self-aligned with a first well.

Another object of the present invention is to provide a method of forming a twin well, which prevents leakage current from being generated at the contact between the first well and semiconductor substrate.

Still another object of the present invention is to provide a method of forming a twin well, which easily controls the surface impurity concentration of the second well, improving reproducibility.

To accomplish the objects of the present invention, there is provided a method of forming a twin well, comprising the steps of forming a field oxide layer on a semiconductor substrate to define active regions of a device, and forming a first mask which exposes a predetermined active region of the semiconductor substrate, ion-implanting a first conductivity type impurity into the exposed region of the semiconductor substrate using the first mask as an ion implantation mask, to form a first well, ion-implanting a second conductivity type impurity to penetrate the first mask, to form a buried region which is self-aligned with the first well and comes into contact with the bottom of the field oxide layer, removing the first mask, and forming a second mask which is to expose the first well of the semiconductor substrate, and ion-implanting a second conductivity impurity into the exposed region of the semiconductor substrate to levels deeper and shallower than the buried region using the second mask as an ion implantation mask, to form a second well including the buried region.

To accomplish the objects of the present invention, there is also provided a method of forming a twin well, comprising the steps of forming a field oxide layer on a semiconductor substrate to define active regions of a device, and forming a first mask which exposes a predetermined active region of the semiconductor substrate, ion-implanting a first conductivity type impurity into the exposed region of the semiconductor substrate several times continuously, varying implantation energy and dose to allow impurity concentration to be varied with depths, using the first mask as an ion implantation mask, to form a first well, ion-implanting a second conductivity type impurity to penetrate the first well and first mask, to form first and second buried regions, the first buried region being isolated from the bottom of the first well, the second buried region being self-aligned with the first well, the second buried region coming into contact with the bottom of the field oxide layer, removing the first mask, and forming a second mask which is to expose the first well of the semiconductor substrate, and ion-implanting a second conductivity impurity into the exposed region of the semiconductor substrate to levels deeper and shallower than the second buried region, varying implantation energy and dose, using the second mask as an ion implantation mask, to form a second well including the second buried region, the second well having impurity concentration which varies with its depth.

It is to be understood that both the foregoing general description and the following detailed description are exemplary and explanatory and are intended to provide further explanation of the invention as claimed.

BRIEF DESCRIPTION OF THE ATTACHED DRAWINGS

The accompanying drawings, which are included to provide a further understanding of the invention and are incorporated in and constitute a part of this specification, illustrate embodiments of the invention and together with the description serve to explain the principles of the invention:

DETAILED DESCRIPTION OF PREFERRED EMBODIMENT

Reference will now be made in detail to the preferred embodiments of the present invention, examples of which are illustrated in the accompanying drawings.

Figure 1A:
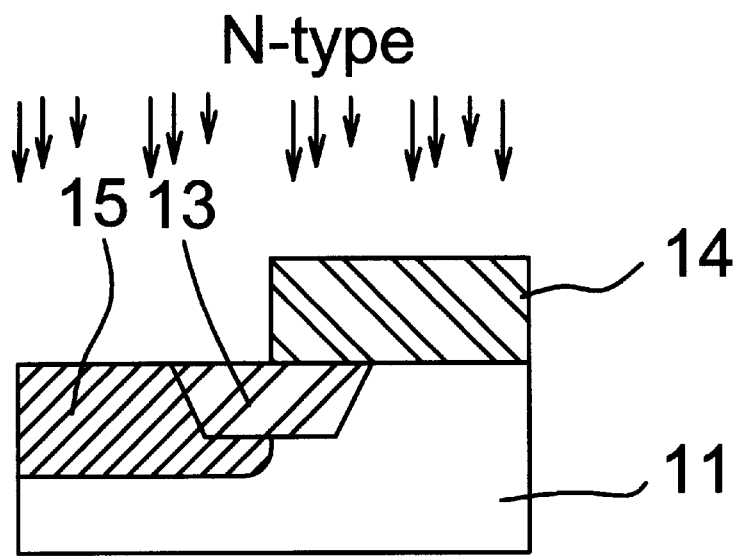
FIGS. 1A and 1B illustrate a conventional method of forming a retrograde twin well.
Figure 1B:
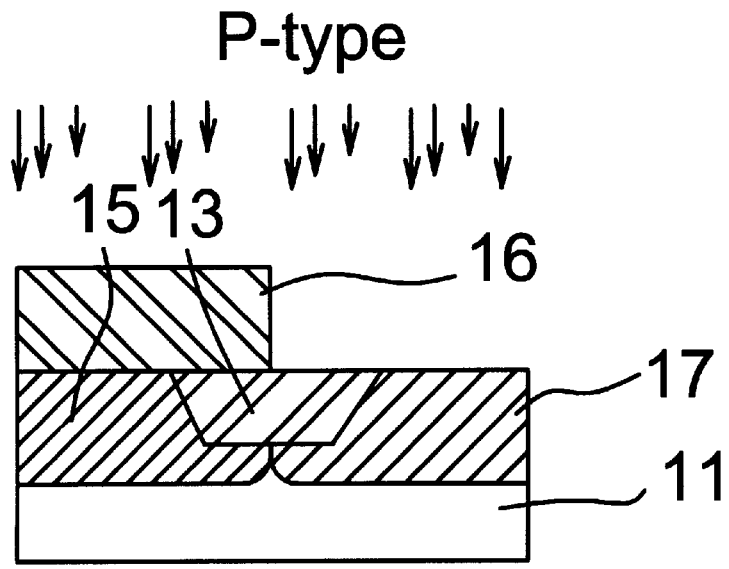
Figure 2A:
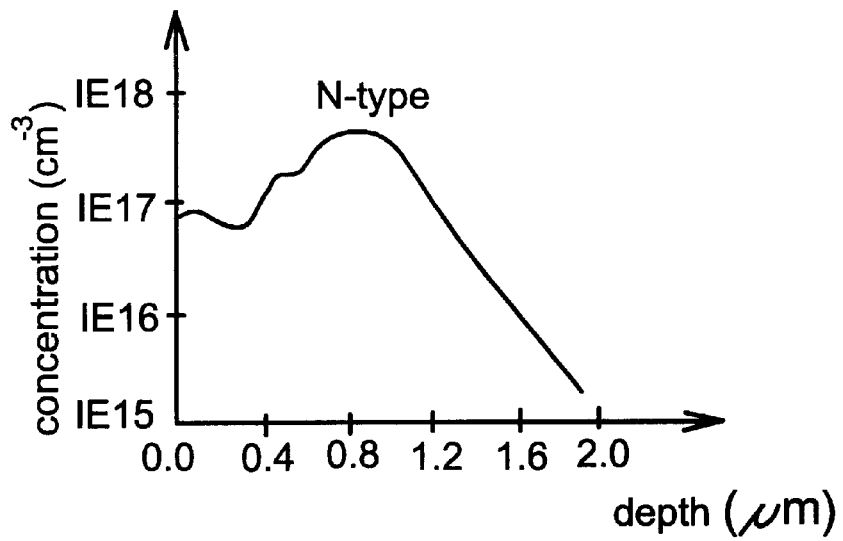
FIGS. 2A and 2B illustrate graphs each of which shows the relationship between the depth and impurity concentration of the conventional retrograde twin well.
Figure 2B:
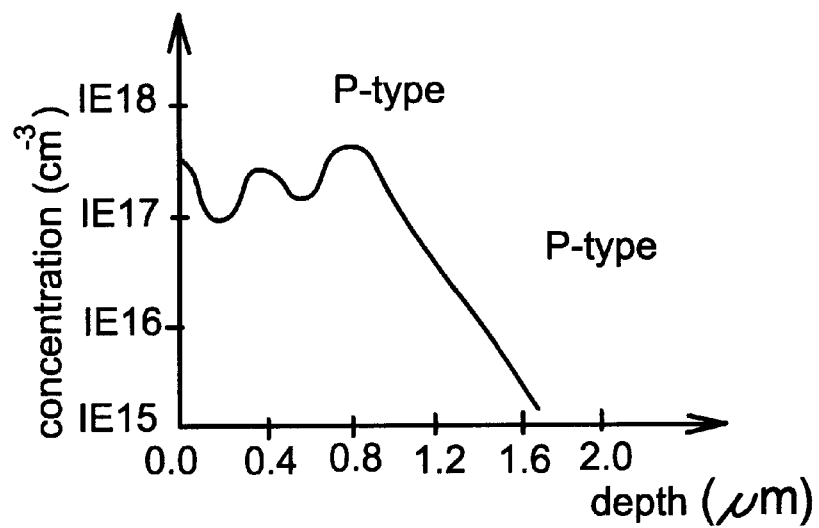
Figure 3A:
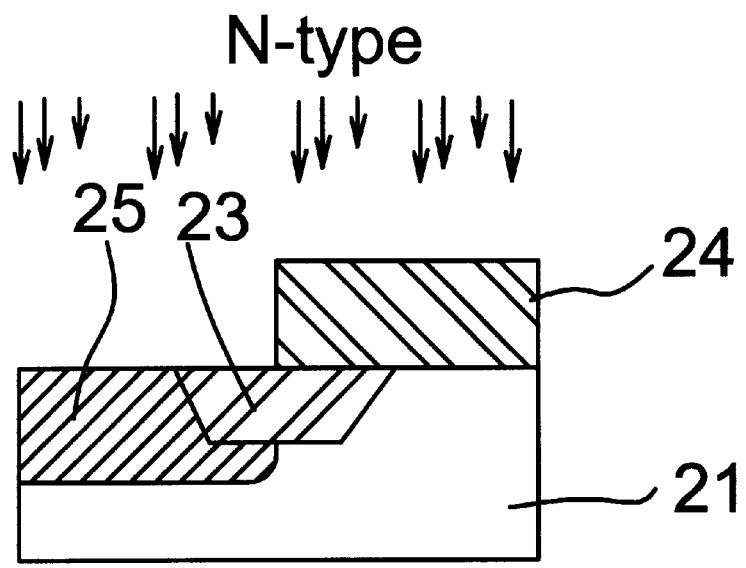
FIGS. 3A and 3B illustrate a conventional method of forming a BILLI retrograde twin well.
Figure 3B:
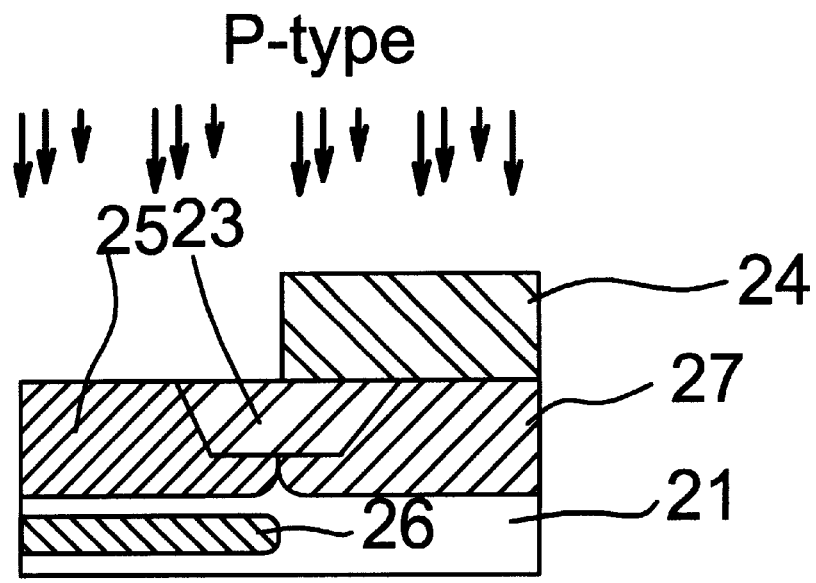
Figure 4A:
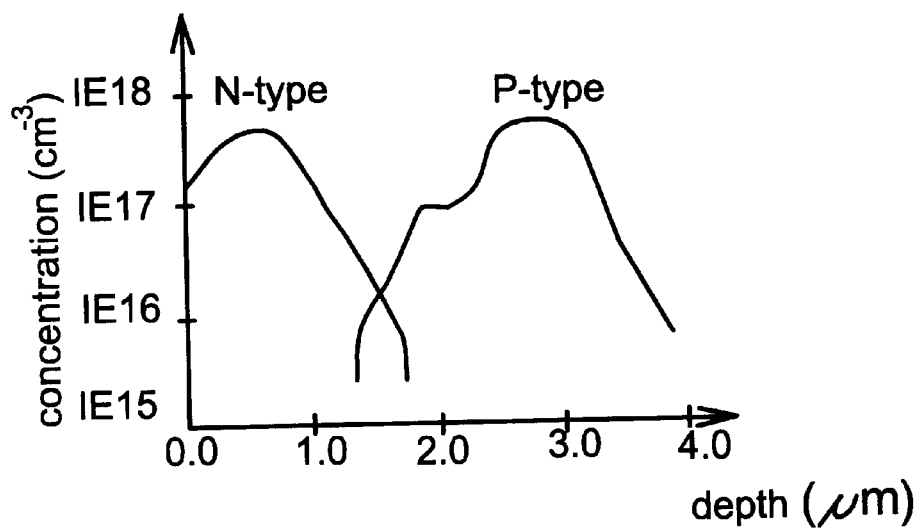
FIGS. 4A and 4B illustrate graphs each of which shows the relationship between the depth and impurity concentration of the conventional BILLI retrograde twin well.
Figure 4B:
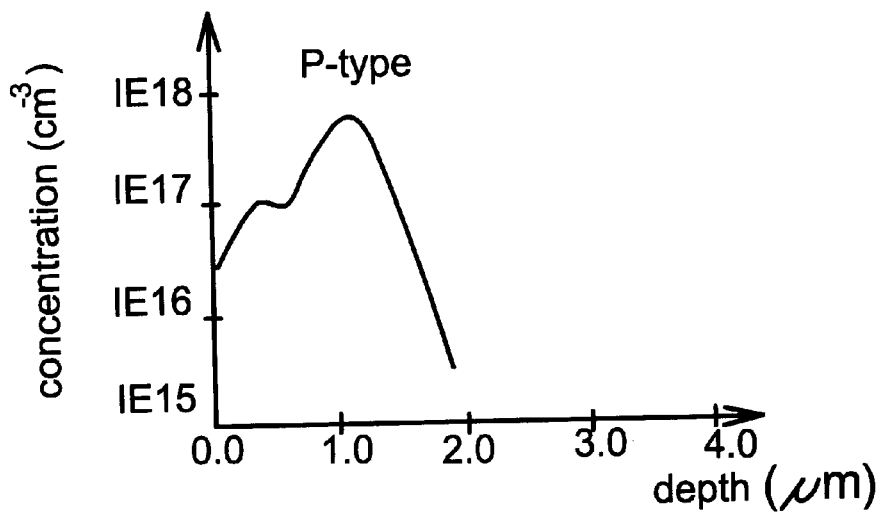
Figure 5A:
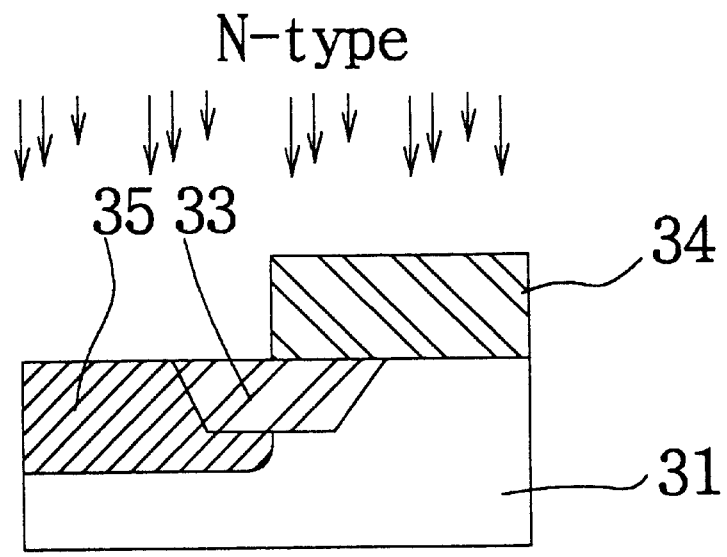
FIGS. 5A, 5B and 5C illustrate a method of forming a twin well according to the present invention.
Figure 5B:
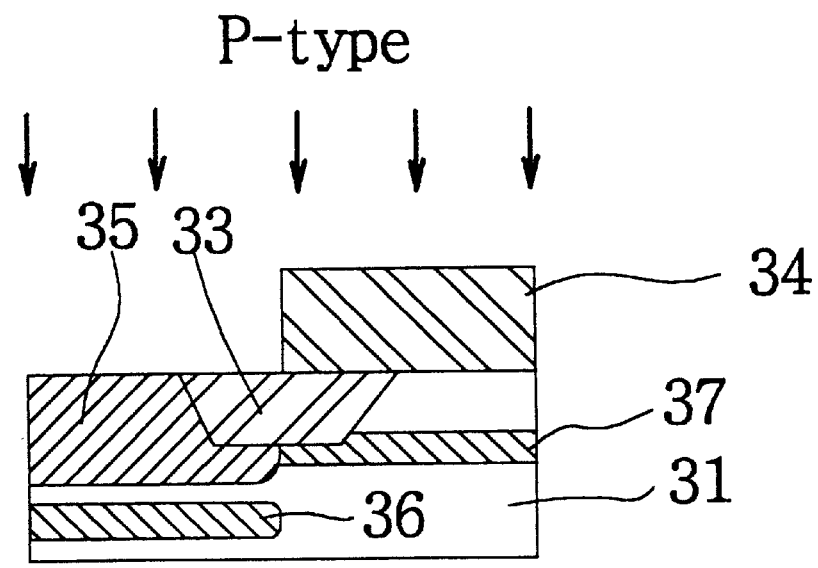
Figure 5C:
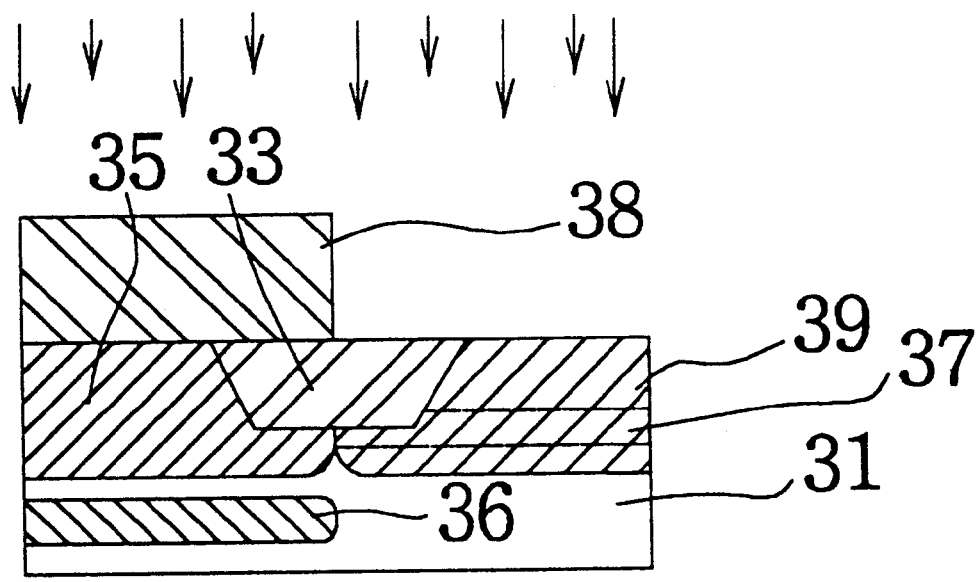

FIGS. 5A, 5B and 5C illustrate a method of forming a twin well according to the present invention.

Referring to FIG. 5A, a field oxide layer 33 is formed on a predetermined portion of a P- or N-type semiconductor substrate 31 through shallow trench isolation (STI) or local oxidation of silicon (LOCOS) process, to define active regions of a device. Photoresist is coated on semiconductor substrate 31 by 2.3 to 2.7 $\mu$m, exposed and developed, to form a first mask 34 exposing a specific active region.

An N-type impurity such as P or As is ion-implanted into the exposed region of semiconductor substrate 31 several times continuously, varying implantation energy and dose, using first mask 34 as an ion implantation mask, forming an N-type well, first well 35.

Specifically, P or As is first implanted with a high energy of 650 to 750 KeV and with a dose of $1\times10^{13}$ to $5\times10^{13}/cm^2$, and implanted a second time with an energy of 200 to 300 KeV and with a dose of $1\times10^{12}$ to $5\times10^{12}/cm^2$. Subsequently, a third implantation is performed with a low energy of 50 to 150 KeV and with a dose of $1\times10^{12}$ to $5\times10^{12}/cm^2$, forming first well 35 having impurity concentration which varies with its depth.

The first implantation increases the impurity concentration of a deeper region of first well 35 to reduce the well resistance, decreasing latch-up of the resultant CMOS transistor. The second implantation improves channel stop effect under field oxide layer 33, and the third implantation controls the surface impurity concentration of first well 35, preventing punch-through.

Referring to FIG. 5B, a P-type impurity such as B or $BF_2$ is ion-implanted into substrate 31 with an energy of 1.3 to 1.7 MeV and with a dose of $1\times10^{12}$ to $6\times10^{12}/cm^2$, forming first and second buried regions 36 and 37.

Here, because of the high ion implantation energy, first buried region 36 is formed under first well 35, and second buried region 37 is formed in contact with the bottom of field oxide layer 33 because the impurity penetrates first mask 34. Accordingly, first and second buried regions 36 and 37 are discontinuous. Second buried region 37 improves channel stop effect of the resultant NMOS transistor. First buried region 36 under first well 35 is formed with the maximum impurity dose of $6\times10^{12}/cm^2$, generating no damage due to ion implantation. Thus, dislocation does not occur at the contact between first well 35 and semiconductor substrate 31, thereby preventing leakage current at this region. Second buried region 37 is formed so that the impurity penetrates first mask 34 to be self-aligned with first well 35.

Referring to FIG. 5C, after removing first mask 34, photoresist is coated on semiconductor substrate 31 by 2.3 to 2.7 $\mu$m, exposed and developed, forming a second mask 38 exposing another region of substrate 31 in which first well 35 is not formed.

A P-type impurity such as B or $BF_2$ is ion-implanted into the exposed region of substrate 31, (that is, the region in which second buried region 37 is formed), several times continuously, varying implantation energy and dose, to form a P-type well 39 including second buried region 37, that is, second well 39. Specifically, B or $BF_2$ is first implanted with a high energy of 450 to 550 KeV and with a dose of $1\times10^{13}$ to $5\times10^{13}/cm^2$ to a level deeper than second buried region 37, and then implanted a second time with a low energy of 0 to 50 KeV and with a dose of $1\times10^{12}$ to $5\times10^{12}/cm^2$ to a level shallower than second buried region 37, forming second well 39 having an impurity concentration which varies with its depth together with second buried region 37. Here, even if second mask 38 is misaligned, first and second wells 35 and 37 are not superposed on or isolated from each other. This prevents the channel stop effect of PMOS and NMOS transistors from being deteriorated. Furthermore, the secondary ion is implanted to a level shallower than second buried region 37 to allow the surface impurity concentration of second well 39 to be easily controlled, improving reproducibility.

Figure 6A:
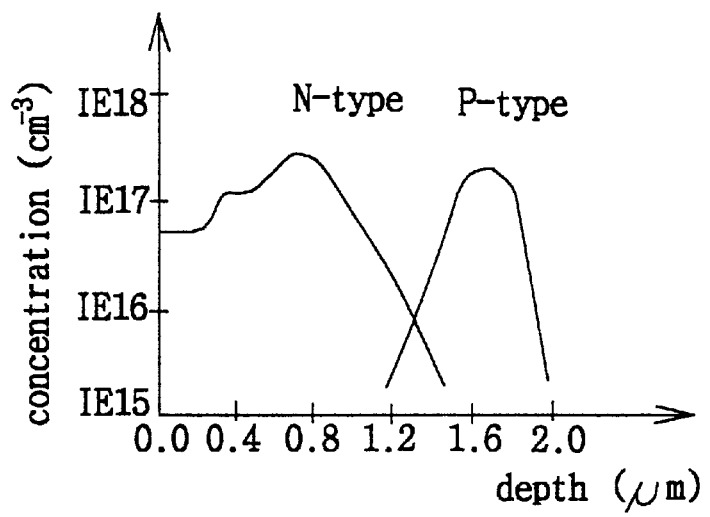
FIGS. 6A and 6B illustrate graphs each of which shows the relationship between the depth and impurity concentration of the twin well according to the present invention.
Figure 6B:
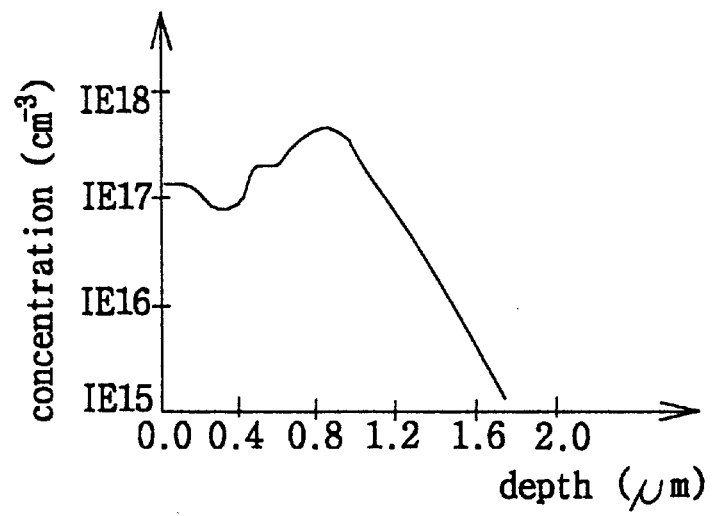

FIGS. 6A and 6B are graphs, each showing the relationship between depth and impurity concentration in the twin well according to the present invention.

FIG. 6A shows the relationship between the impurity concentration and depth of first well 35, and FIG. 6B shows the relationship between the impurity concentration and depth of second well 39.

In FIG. 6A, the curve corresponding to shallower region denotes the impurity concentration of first well 35, and curve corresponding to deeper region denotes first buried region 37 under first well 35.

Referring to FIG. 6A, N-type impurity concentration of first well 35 increases with increasing depth from the surface of substrate 31, reaches its peak of $1 \times 10^{17}$ to $5 \times 10^{17}/cm^3$ at a depth of 0.6 to 0.8 $\mu$m, and then starts to decrease.

P-type impurity concentration in first buried region 37 formed under first well 35 increases in the region where the N-type impurity concentration is reduced, reaches its peak of about $1 \times 10^{17}/cm^3$ at a depth of 1.5 to 2.0 $\mu$m, and then starts to decrease. Thus, the well resistance is reduced, decreasing latch-up. The impurity concentration of first buried region 37 is low because the impurity dose used for formation of first buried region 37 is less than $6 \times 10^{12}/cm^2$. This prevents dislocation from occurring between first well 35 and semiconductor substrate 31 and suppresses leakage current.

Referring to FIG. 6B, N-type impurity concentration of second well 37 increases to reach its peak of $1 \times 10^{17}$ to $5 \times 10^{17}/cm^3$ at a depth of 0.8 to 1.0 $\mu$m, reducing the well resistance and decreasing latch-up.

In the method of forming a twin well according to the present invention, as described above, an N-type impurity is implanted using the first mask as an ion implantation mask to form the first well. A P-type impurity is then implanted to penetrate the first mask to form the second buried region which contacts the bottom of the field oxide layer and is self-aligned with the first well. Finally, a P-type impurity is implanted using the second mask as an ion implantation mask to form the second well including the second buried region. Accordingly, the second well can be formed in self-alignment with the first well. Furthermore, a small amount of impurity dose used for forming the first buried region does not cause damage due to ion implantation, thereby preventing leakage current from flowing at the contact surface between the first well and semiconductor substrate. Moreover, the impurities are implanted into the exposed region of the substrate to allow the surface impurity concentration of the second well to be controlled easily, improving reproducibility.

It will be apparent to those skilled in the art that various modifications and variations can be made in the method of forming a twin well of the present invention without departing from the spirit or scope of the invention. Thus, it is intended that the present invention cover the modifications and variations of this invention provided they come within the scope of the appended claims and their equivalents.

What is claimed is:

1. A method of forming a twin well, comprising the steps of:

forming a field oxide layer on a semiconductor substrate to define active regions of a device, and forming a first mask which exposes a predetermined active region of the semiconductor substrate;

ion-implanting a first conductivity type impurity into the exposed region of the semiconductor substrate using the first mask as an ion implantation mask, to form a first well;

ion-implanting a second conductivity type impurity to penetrate the first mask, to form a buried region which is self-aligned with the first well and comes into contact with the bottom of the field oxide layer;

removing the first mask, and forming a second mask which is to expose the first well of the semiconductor substrate; and ion-implanting a second conductivity impurity into the exposed region of the semiconductor substrate to levels deeper and shallower than the buried region using the second mask as an ion implantation mask, to form a second well including the buried region.

2. The method of forming a twin well as claimed in claim 1, wherein the first well is formed in such a manner that the first conductivity type impurity is ion-implanted several times continuously, varying implantation energy and dose.

3. The method of forming a twin well as claimed in claim 2, wherein the first well is formed in such a manner that the first conductivity type impurity is primarily implanted with an energy of 650 to 750 KeV and with a dose $1 \times 10^{13}$ to $5 \times 10^{13}/cm^2$, secondarily implanted with an energy of 200 to 300 KeV and with a dose of $1 \times 10^{12}$ to $5 \times 10^{12}/cm^2$, and thirdly implanted with an energy of 50 to 150 KeV and with a dose of $1 \times 10^{12}$ to $5 \times 10^{12}/cm^2$, to allow its impurity concentration to be varied with its depth.

4. The method of forming a twin well as claimed in claim 1, wherein the buried region is formed in such a manner that the second conductivity impurity is ion-implanted with an energy of 1.3 to 1.7 MeV and with a dose of $1 \times 10^{12}$ to $6 \times 10^{12}/cm^2$.

5. The method of forming a twin well as claimed in claim 1, wherein the second conductivity type impurity is ion-implanted with an anergy of 450 to 550 KeV to a level deeper than the buried region.

6. The method of forming a twin well as claimed in claim 5, wherein the second conductivity type impurity is ion-implanted with a dose of $1 \times 10^{13}$ to $5 \times 10^{13}/cm^2$.

7. The method of forming a twin well as claimed in claim 1, wherein the second conductivity type impurity is ion-implanted with an energy of 30 to 50 KeV to a level shallower than the buried region.

8. The method of forming a twin well as claimed in claim 7, wherein the second conductivity type impurity is ion-implanted with a dose of $1 \times 10^{13}$ to $5 \times 10^{13}/cm^2$ to a level shallower than the buried region.

9. A method of forming a twin well, comprising the steps of:

forming a field oxide layer on a semiconductor substrate to define active regions of a device, and forming a first mask which exposes a predetermined active region of the semiconductor substrate;

ion-implanting a first conductivity type impurity into the exposed region of the semiconductor substrate several times continuously, varying implantation energy and dose to allow impurity concentration to be varied with depths, using the first mask as an ion implantation mask, to form a first well;

ion-implanting a second conductivity type impurity to penetrate the first well and first mask, to form first and second buried regions, the first buried region being isolated from the bottom of the first well, the second buried region being self-aligned with the first well, the second buried region coming into contact with the bottom of the field oxide layer;

removing the first mask, and forming a second mask which is to expose the first well of the semiconductor substrate; and ion-implanting a second conductivity impurity into the exposed region of the semiconductor substrate to levels deeper and shallower than the second buried region, varying implantation energy and dose, using the second mask as an ion implantation mask, to form a second well including the second buried region, the second well having impurity concentration which varies with its depth.

* * * * *